United States Patent [19]

Yen et al.

[11] 4,249,146

[45] Feb. 3, 1981

[54] SURFACE ACOUSTIC WAVE RESONATORS UTILIZING HARMONIC FREQUENCIES

[75] Inventors: Kuo-Hsiung Yen, Manhattan Beach; Kei-Fung Lau, Harbor City; Reynold S. Kagiwada, Los Angeles, all of Calif.

[73] Assignee: TRW Inc., Redondo Beach, Calif.

[21] Appl. No.: 14,393

[22] Filed: Feb. 23, 1979

[51] Int. Cl.$^3$ .................. H03H 9/25; H03H 9/64; H03H 9/145; H04R 17/10
[52] U.S. Cl. ........................... 333/195; 331/107 A; 333/196
[58] Field of Search ................ 333/150–155, 333/193–196; 310/313; 331/107 A; 330/5.5

[56] References Cited

U.S. PATENT DOCUMENTS

| | | | |
|---|---|---|---|
| 3,936,774 | 2/1976 | Mellon et al. | 333/151 |
| 3,961,293 | 6/1976 | Hartmann et al. | 333/195 |
| 3,987,376 | 10/1976 | Kerbel | 333/154 |

OTHER PUBLICATIONS

Joseph et al.–"Surface Acoustic Wave Planar Resonator Using Grating Reflectors" in Applied Physics Letters, vol. 26, No. 2, Jan. 15, 1975; pp. 29–31.

*Primary Examiner*—Marvin L. Nussbaum
*Attorney, Agent, or Firm*—Robert W. Keller; John J. Connors

[57] ABSTRACT

A surface acoustic resonator including an interdigital transducer configured to generate acoustic waves at at least one harmonic frequency, and a pair of reflection gratings capable of essentially total reflection of the acoustic waves in both fundamental and harmonic modes of operation. One-port and two-port resonators are disclosed, capable of operation at fundamental and harmonic frequencies, to provide a higher frequency of operation without correspondingly higher resolution requirements for manufacturing processes. For single-mode operation at higher frequencies, the interdigital transducer and reflection gratings have different fundamental frequencies, and utilize harmonics of different order but the same actual frequency, such that the resonator functions at a single frequency, which may be, for example, the third harmonic with respect to the transducer fundamental frequency, and the second harmonic with respect to the reflection grating-fundamental frequency.

4 Claims, 16 Drawing Figures

SURFACE ACOUSTIC WAVE RESONATORS UTILIZING HARMONIC FREQUENCIES

BACKGROUND OF THE INVENTION

This invention relates generally to surface acoustic wave devices, and, more particularly, to surface acoustic wave resonators for use in a variety of very high frequency applications in the communications and signal processing fields.

Surface acoustic wave (SAW) devices are a relatively new class of devices that utilize the propagation of ultrasonic acoustic waves in piezoelectric materials. In recent years, such devices have been advanced to a very practical stage of development, and they are now widely used in communications and signal processing systems. Ultrasonic waves provide the basis of a useful class of filters and resonators because such waves travel with negligible loss in suitable solids, at typical velocities of $10^3$ to $10^4$ meters per second. These velocities correspond to operating frequencies in the range of 30 to 800 megahertz (MHz) for practical surface acoustic wave devices.

When an acoustic wave is propagated along the surface of a piezoelectric material or substrate, a traveling electric field is also generated on the surface. This field also extends significantly above the surface, and can interact with appropriately constructed metal electrodes disposed on the surface. These electrodes typically take the form of an interdigital transducer, formed on the surface by photolithographic techniques. An interdigital transducer is a two-terminal device comprising a plurality of parallel metal fingers uniformly spaced on the surface of the piezoelectric substrate. The fingers are connected, usually in alternating fashion, to two terminal strips, giving the appearance of two combs with their teeth interleaved but not touching. When a voltage is applied across the terminals of an interdigital transducer, electric fields are generated within the substrate, and these generate corresponding stress patterns in accordance with the piezoelectric effect. If the voltage applied to the terminals is an alternating signal of suitable frequency, the value of which is dictated by the transducer finger spacings, elastic surface waves are launched in two opposite directions perpendicular to the transducer fingers.

Further background information on surface acoustic wave devices in general can be obtained from a variety of publications. For example, a book entitled "Surface Wave Filters, Design, Construction, and Use", edited by Herbert Mathews, and published by John Wiley and Sons, New York (1977), contains a good deal of useful background material on surface acoustic wave devices, as well as a comprehensive bibliography on the subject.

In a typical surface acoustic wave filter device, another interdigital transducer is used to receive the transmitted acoustic waves and to convert them back into an electrical signal. A resonator, on the other hand, operates by reflecting the propagated wave back on itself many times. An acoustic wave resonator comprises an interdigital transducer of the same general type just described, and two reflection gratings positioned one on each side of the transducer to form a resonant cavity in which the waves propagated from the transducer are repeatedly reflected back on themselves. The reflection gratings can be designed to have a reflection coefficient of almost unity at a selected frequency, and if the distance between the inside edges of the two gratings is an integral multiple of half-wavelengths, waves reflected back and forth between the two gratings will have the same phase and will add coherently. The cavity then resonates at the frequency of maximum reflection, and a standing wave is generated within the cavity.

The trend in the design of surface acoustic wave resonators has been toward higher and higher frequencies of operation, this trend being aggravated by an increasingly crowded communications frequency spectrum, and by the increased use of spread spectrum techniques in communications. Such higher operating frequencies dictate the use of correspondingly smaller grating element spacings and interdigital transducer finger spacings. As the resolution limits of photolithographic processes are approached, it becomes less practical to manufacture such devices capable of operation at high frequencies. It would, therefore, be desirable to be able to construct a resonator in such a manner that it would be capable of operation at frequencies higher than the fundamental frequency. The present invention is directed to this end.

SUMMARY OF THE INVENTION

The present invention resides in a surface acoustic wave resonator capable of operation either in a harmonic mode or in both fundamental and harmonic modes. Basically, and in general terms, the resonator of the invention comprises an interdigital transducer so constructed as to generate acoustic waves at a fundamental frequency and at least one harmonic frequency, and two reflection gratings disposed one on each side of the transducer and also having both fundamental and harmonic modes of operation. In the harmonic mode of operation, a higher frequency of operation of the resonator is attained without the need for increased photolithographic resolution requirements.

More specifically, the transducer employed in one embodiment of the invention is a three-finger-per-period transducer capable of producing acoustic waves at the fundamental, second harmonic and higher harmonic frequencies. The reflection gratings also have the capability of operating in both fundamental and harmonic modes, particularly the second harmonic mode.

Although it is possible to operate a resonator of the type described simultaneously in both the fundamental and harmonic modes, it is also possible, and usually desirable, to obtain a single mode of operation at a higher harmonic frequency. This is achieved by configuring the device in such a manner that the transducer and the reflection gratings have different fundamental frequencies, but also operate at harmonics of different order, corresponding to one selected frequency. For example, a four-finger-per-period transducer can be employed, having fundamental, third, and higher harmonic modes of operation, together with reflection gratings having a fundamental frequency fifty percent higher than the transducer fundamental frequency. Accordingly, a single mode of operation is obtained, at a frequency that is the third harmonic frequency with respect to the transducer and the second harmonic frequency with respect to the reflection grating. Since this frequency is the only one at which both the transducer and the reflection grating can operate, the resonator will operate in this single mode at a desired high frequency.

It will be appreciated from the foregoing that the present invention represents a significant advance in the field of surface acoustic wave resonators. In particular, it provides a resonator having higher frequency of operation without a correspondingly high resolution in the photolithographic fabrication process. Other aspects and advantages of the invention will become apparent from the following more detailed description, taken in conjunction with the accompanying drawings.

DESCRIPTION OF THE PREFERRED EMBODIMENTS

Figure 1:
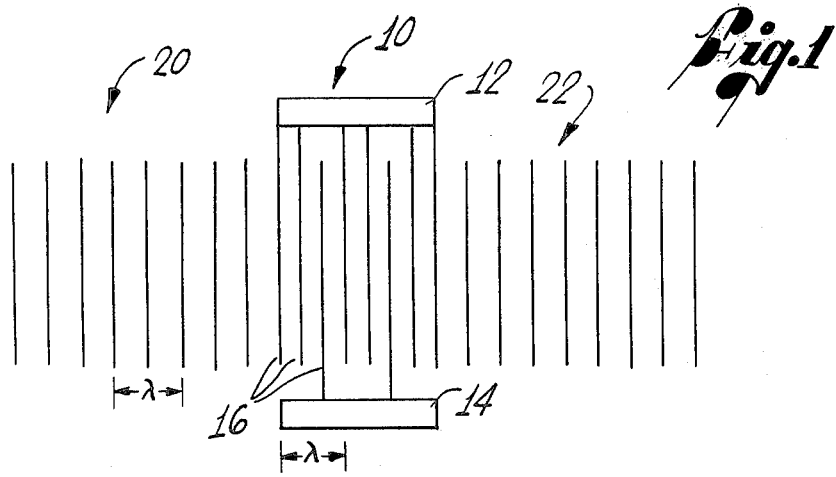
FIG. 1 is a diagrammatic plan view of a one-port surface acoustic wave resonator constructed in accordance with the present invention.

As shown in the drawings for purposes of illustration, the present invention is concerned with an improved type of surface acoustic wave resonator, and to a technique for obtaining a frequency of operation higher than the fundamental frequency, without the necessity for a correspondingly higher resolution in the fabrication process.

In accordance with the invention, a surface acoustic wave resonator is constructed in such a manner as to operate in a harmonic mode, either as its sole mode of operation, or simultaneously with the fundamental mode of operation. FIG. 1 shows diagrammatically a one-port resonator configured in accordance with the invention. Such a resonator includes an interdigital transducer, indicated by reference numeral 10, configured as a three-finger-per-period transducer. The transducer 10 comprises first and second sum bars 12 and 14 from which a plurality of fingers 16 extend in the typical interleaved fashion of interdigital transducers. However, rather than employing an alternating sequence involving one finger from each sum bar in turn, the pattern is such that two fingers extend from the first sum bar 12, then one finger from the second sum bar 14, two fingers from the first sum bar again, and so on. The periodic spacing of the transducer, as measured, for example, from one finger extending from the second sum bar to the next finger extending from the same sum bar, is equivalent to one wavelength at the fundamental mode of operation of the transducer. As is well known in the art, this three-finger-per-period transducer configuration generates acoustic waves at the fundamental frequency, at the second harmonic frequency, and at the seventh and eighth harmonic frequencies.

As shown in FIG. 1, located on each side of the transducer 10 are two reflection gratings 20 and 22, having periodic finger spacings of one half-wavelength measured at the fundamental frequency. The gratings 20 and 22 provide essentially total reflection of acoustic energy at the fundamental frequency, as well as at the second harmonic frequency. The reflections from gratings at the fundamental frequency are, of course, due to surface discontinuities provided by the grating structure. As the second harmonic frequency, reflection is thought to be caused by stored energy at each step junction of a grating discontinuity.

Figure 4A:
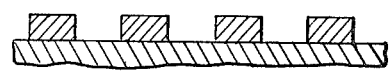
FIGS. 4a–4h are diagrammatic cross-sectional view of various types of reflection gratings.
Figure 4B:
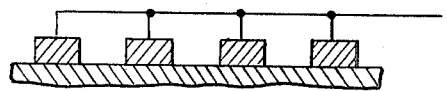
Figure 4C:
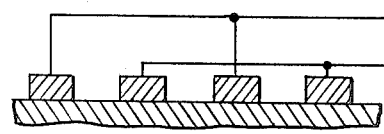
Figure 4D:
Figure 4E:
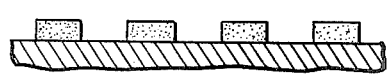
Figure 4F:
Figure 4G:
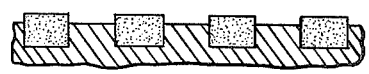
Figure 4H:

By way of example, the resonator of FIG. 1 was constructed with gratings having 300 shorted metallic lines each, essentially of the type shown in the cross-sectional view of FIG. 4b. It will be appreciated, however, that an effective resonator could also be fabricated using other reflector cross sections, selected from the types shown in FIGS. 4a–4h. The material used for the piezoelectric substrate in this example was YZ lithium niobate (LiNbO$_3$), where the letter Y indicates that the material is a Y cut crystal, and the letter Z indicates the direction of propagation in the crystal.

Figure 2:
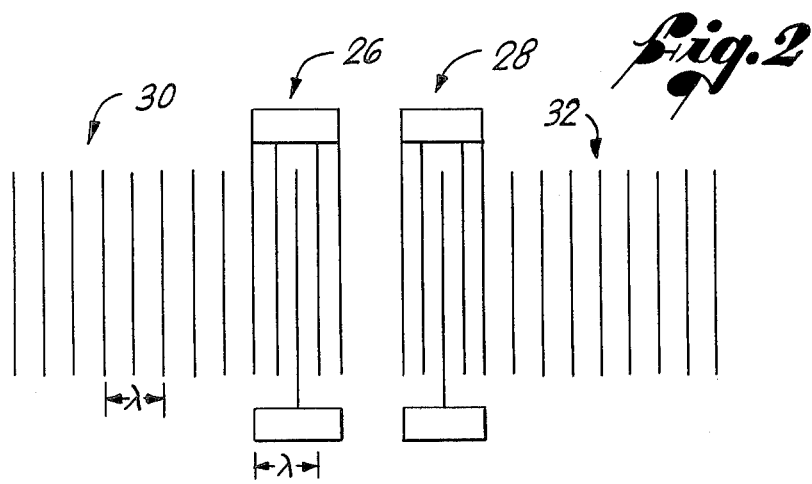
FIG. 2 is a diagrammatic plan view of a two-port surface acoustic wave resonator also constructed in accordance with the present invention.

FIG. 2 diagrammatically illustrates a two-port surface acoustic wave resonator having two interdigital transducers 26 and 28, again of the three-finger-per-period type, and two reflection gratings 30 and 32 similar to those shown in FIG. 1.

Figure 3:
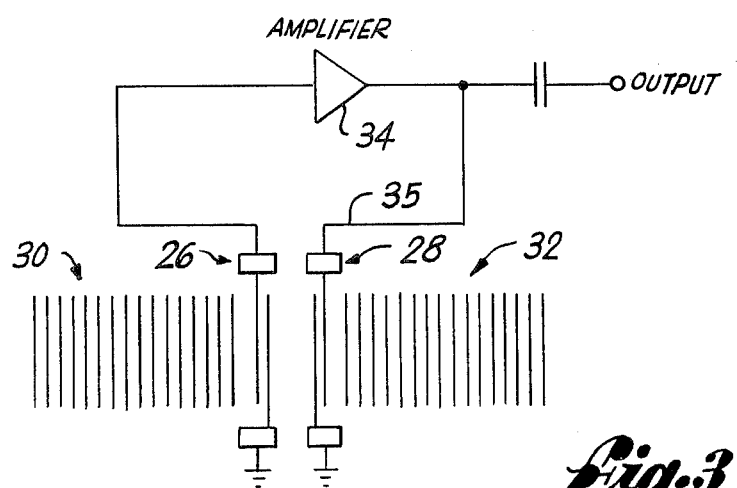
FIG. 3 is a simplified schematic view showing how a two-port resonator is typically employed in a resonator circuit.

It will be appreciated that both the one-port and two-port resonators are typically employed in oscillator circuits, such as the one shown in FIG. 3, having a relatively high-gain amplifier 34 with a positive feedback loop, as indicated at 35. The amplifier compensates for any losses in the resonator and maintains it in an oscillatory state. Such oscillator circuits are well known in the surface acoustic wave art and will not be described in detail in this specification.

Figure 6A:
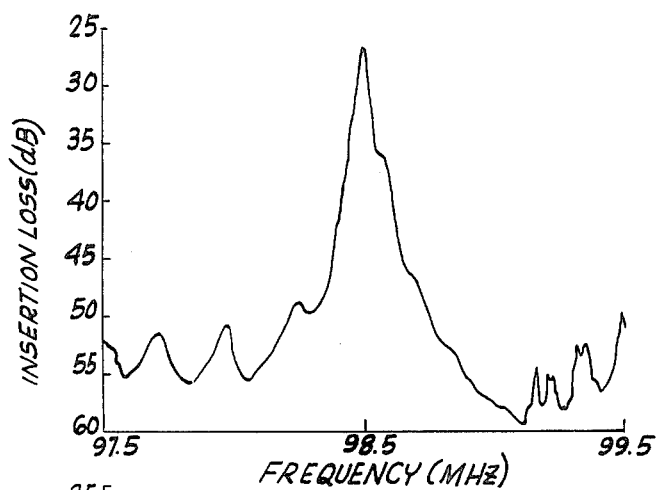
FIGS. 6a and 6b are graphs of the fundamental and second harmonic frequency responses of the one-port surface acoustic wave resonator shown in FIG. 1.
Figure 6B:
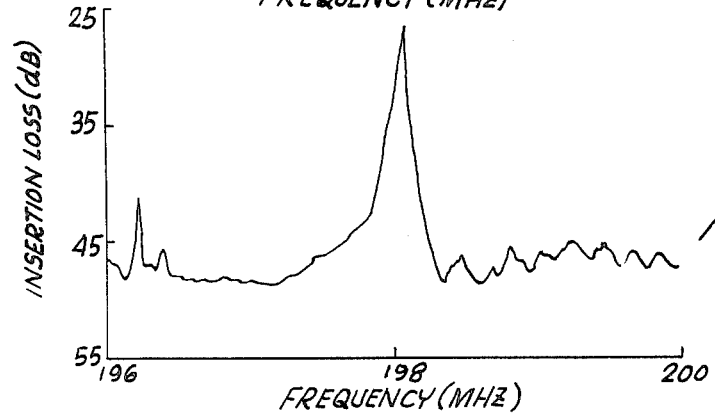

FIGS. 6a and 6b give the fundamental and second harmonic frequency response characteristics of the one-port surface acoustic wave device shown in FIG. 1. It will be noted that the resonator has almost the same insertion loss at the second harmonic mode as in the fundamental mode. For the one-port resonator, the measured value of the Q factor, which is a measure of the sharpness of resonance, or frequency selectivity of a resonator, was 4,500 at the fundamental frequency and 6,200 at the second harmonic frequency.

Figure 7A:
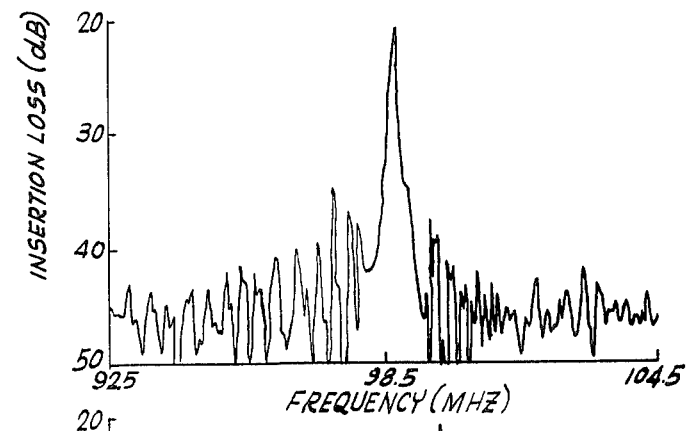
FIGS. 7a and 7b are graphs of the fundamental and second harmonic frequency responses of the two-port surface acoustic wave resonator shown in FIG. 2.
Figure 7B:
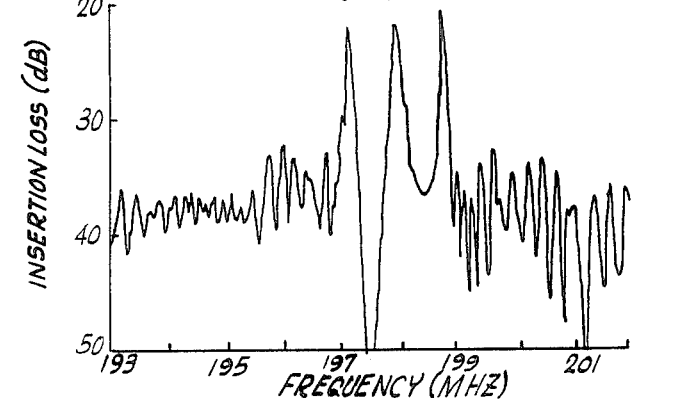

The corresponding frequency response curves for the two-port resonator are shown in FIGS. 7a and 7b. The two-port resonator has a measured Q value of 2,750 at the fundamental frequency, and 3,150 at the second harmonic frequency.

Figure 5:
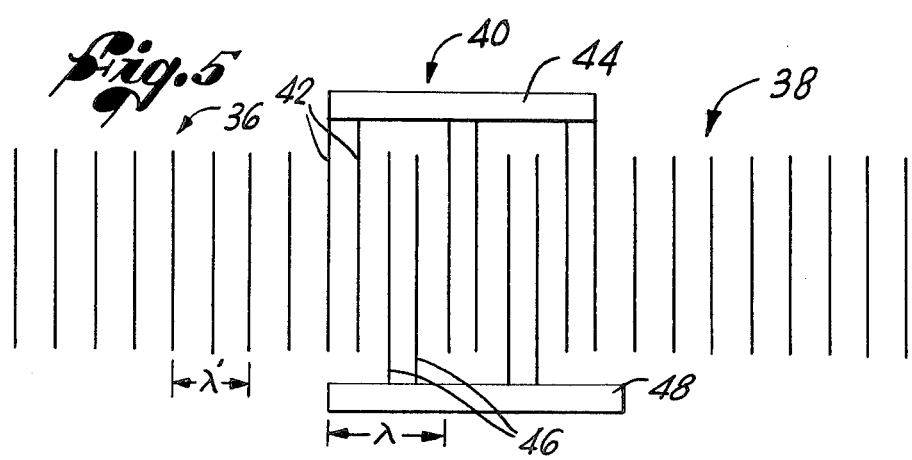
FIG. 5 is a diagrammatic plan view of an alternate embodiment of the invention, with a single mode of oscillation.

The resonator shown in FIG. 5 is exemplary of how the invention can be utilized to operate in a single harmonic mode. This resonator includes two reflection gratings 36 and 38, of the same type as employed in the resonators shown in FIGS. 1 and 2, but utilizes an interdigital transducer 40 of the four-finger-per-period type. The four-finger-per-period transducer 40 has two consecutive fingers 42 extending inwardly from a first sum bar 44, two fingers 46 extending inwardly from a second sum bar 48, two fingers 50 extending from the first sum bar, and so on. There are a total of four fingers in a space of one complete period or wavelength at the fundamental frequency. The four-finger-per-period transducer has the characteristic of operating both in fundamental mode and in the third, ninth and eleventh harmonic modes. The reflection gratings 36 and 38, as in the earlier described embodiments, are capable of operation in the fundamental and second harmonic modes. The transducer 40 is so configured that its third harmonic frequency is at a desired frequency $f_O$. The reflection gratings 36 and 38 are configured to operate at a different fundamental frequency from the transducer, but with a second harmonic frequency corresponding exactly to the frequency $f_O$. Since $f_O$ is the only frequency at which both the transducer 40 and the reflection gratings 36 and 38 can function, the resonator will respond only at this frequency.

It will be appreciated from the foregoing that the present invention represents a significant advance in the field of surface acoustic wave resonators. In particular, the invention provides a resonator capable of operation at higher frequencies than its fundamental frequency, without the necessity for correspondingly finer resolution in the manufacturing process. It will also be appreciated that, although a number of specific embodiments have been defined herein by way of example, various modifications may be made without departing from the spirit and scope of the invention. Accordingly, the invention is not to be limited except as by the appended claims.

We claim:

1. An acoustic wave resonator comprising:
   a piezoelectric substrate;
   an interdigital transducer disposed on said substrate and capable of operation at a fundamental frequency and at least one harmonic frequency; and
   two reflection gratings disposed on said substrate, one on each side of said interdigital transducer, to form a resonant cavity capable of operation in fundamental and harmonic frequency modes, including at least a second harmonic mode;
   and wherein a selected frequency mode of operation of said reflection gratings results in reflection of acoustic energy of a frequency higher than the fundamental frequency of said transducer.

2. An acoustic wave resonator comprising:
   a piezoelectric substrate;
   an interdigital transducer disposed on said substrate and capable of operation at a fundamental frequency and at least one harmonic frequency; and
   two reflection gratings disposed on said substrate, one on each side of said interdigital transducer, to form a resonant cavity and to operate in at least one frequency mode in which there is reflection of acoustic energy of a frequency higher than the fundamental frequency of said transducer;
   and wherein
   said interdigital transducer is of the three-finger-per-period type, capable of operation in fundamental and second harmonic modes,
   said reflection gratings are also capable of operation in fundamental and second harmonic modes, and
   the fundamental frequencies of said transducer and said gratings are the same, whereby said resonator can operate simultaneously in the fundamental and harmonic modes.

3. An acoustic wave resonator as set forth in claim 2, and further including a second interdigital transducer adjacent to said first-mentioned interdigital transducer, and also located between said reflection gratings, whereby said resonator operates as a two-port device.

4. An acoustic wave resonator comprising:
   a piezoelectric substrate;
   an interdigital transducer disposed on said substrate and capable of operation at a fundamental frequency and at least one harmonic frequency; and
   two reflection gratings disposed on said substrate, one on each side of said interdigital transducer, to form a resonant cavity and to operate in at least one frequency mode in which there is reflection of acoustic energy of a frequency higher than the fundamental frequency of said transducer;
   and wherein
   said interdigital transducer is of the four-finger-per-period type, capable of operation in fundamental and third harmonic modes,
   said reflection gratings are capable of operation in fundamental and second harmonic modes, and
   the fundamental frequency of operation of said transducer is two-thirds the fundamental frequency of operation of said gratings, whereby said resonator can operate in a single-frequency mode, which is a third harmonic mode with respect to said transducer and a second harmonic mode with respect to said gratings.

* * * * *